United States Patent [19]

Kodama

[11] Patent Number: 5,767,522

[45] Date of Patent: Jun. 16, 1998

[54] ION-IMPLANTATION SYSTEM USING SPLIT ION BEAMS

[75] Inventor: Shuichi Kodama, Tokyo, Japan

[73] Assignee: NEC Corporation, Tokyo, Japan

[21] Appl. No.: 901,087

[22] Filed: Jul. 28, 1997

[30] Foreign Application Priority Data

Jul. 30, 1996 [JP] Japan ................................. 8-200721

[51] Int. Cl.[6] ................................................ H01J 37/317
[52] U.S. Cl. .............................. 250/492.21; 250/398
[58] Field of Search .............................. 250/492.21, 398

[56] References Cited

U.S. PATENT DOCUMENTS 4,209,704   6/1980   Krimmel ......................... 250/492.21
4,276,477   6/1981   Enge .............................. 250/492.21

*Primary Examiner*—Kiet T. Nguyen
*Attorney, Agent, or Firm*—Whitham, Curtis & Whitham

[57] ABSTRACT

An ion-implantation system is provided, which is capable of successive ion-implantation processes into a same target under different ion-implantation conditions. This system has an ion generator for generating an initial ion beam of charged ions, an ion-beam splitter for splitting the initial ion beam into first to n-th ion beams where n is an integer greater than unity, an acceleration-energy controller for independently controlling the acceleration energies of the first to n-th ion beams, an ion-beam selector for selecting one of the first to n-th ion beams, and a target holder for holding a target thereon. The selected one of the first to n-th ion beams is irradiated to the target on the target holder, thereby implanting the charged ions contained in the initial ion beam into the target. The acceleration-energy controller may include an acceleration and/or deceleration tube for accelerating and/or decelerating the first to n-th ion beams.

8 Claims, 6 Drawing Sheets

ION-IMPLANTATION SYSTEM USING SPLIT ION BEAMS

BACKGROUND OF THE INVENTION

1. Field of the Invention

The present invention relates to an ion-implantation system and more particularly, to an ion-implantation system used preferably in semiconductor device fabrication, in which an initial ion beam emitted from an ion generator is split into a plurality of split ion beams prior to irradiation to a target.

2. Description of the Prior Art

FIG. 1 schematically shows a conventional ion-implantation system, in which an ion source 281 generates charged ions (i.e., ionized atoms or molecules) and other species.

The charged ions generated in the source 281 are extracted and accelerated by an extraction magnet 282 provided near the outlet of the ion source 281. Thus, a beam 273 of the charged ions is emitted through the extraction magnet 282 toward an analyzer magnet 283. The beam 273 travels within a vacuum tube 302 where the inside is kept in vacuum.

Due to the magnetic field from the analyzer magnet 283, the ions with a desired charge in the beam 273 are selectively taken out of the magnet 283. Thus, an initial ion beam 270 of the desired dopant ions is emitted from the magnet 283 into a vacuum tube 301 where the inside is kept in vacuum.

The initial ion beam 270 is then split into first and second ion beams 271 and 272 by a beam-splitting magnet 284 located in the vacuum tube 301. The first and second split ion beams 271 and 272 thus formed are collimated by first and second collimator magnets 285A and 285B and then, they are irradiated toward corresponding semiconductor wafers 290 placed on a disk-shaped wafer holder or table 300, respectively. The first and second collimator magnets 285A and 285B and the wafer holder or table 300 are located in the tube 301. The wafers 290 to be ion-implanted are placed on the table 300 and removed therefrom by using a wafer loader (not shown).

First and second beam shutters 286A and 286B are provided in the vacuum tube 301 on the paths of the beams 271 and 272, respectively. Both the shutters 286A and 286B are designed to be opened or closed simultaneously.

If the beam shutters 286A and 286B are opened, the first and second split beams 271 and 272 are simultaneously irradiated to the corresponding wafers 290, thereby implanting the desired dopant ions into the wafers 290. If both the beam shutters 286A and 286B are closed, the split beams 271 and 272 are blocked and therefore, no dopant ions are implanted into the wafers 290.

The first and second ion beams 271 and 272 are scanned by a beam scanner (not shown) located in the tube 301 between the wafer holder 300 and the beam shutters 286A and 286B. The two beams 271 and 372 are scanned along two orthogonal directions in a plane approximately perpendicular to their traveling paths, thereby scanning the beams 271 and 372 over the whole corresponding wafers 290.

The reason why the ion beam 270 is split into the two split beams 271 and 272 is to decrease the density of the dopant ions implanted into each of the wafers 290, thereby preventing the charge built-up phenomenon from occurring on the wafers 290.

With the conventional ion-implantation system as shown in FIG. 1, although the mechanism for splitting the initial ion beam 270 into the first and second ion beams 271 and 272 is provided, both the beams 271 and 272 are designed to be simultaneously irradiated to the corresponding wafers 290 and simultaneously blocked not to reach the corresponding wafers 290 with the use of the shutters 286A and 286B. Also, since the beams 271 and 272 are generated by simply splitting the initial ion beam 270 into two, they have the same acceleration energy.

Therefore, the first and second split ion beams 271 and 272 are unable to be successively irradiated to the same wafer 290 under different ion-implantation conditions.

Specifically, after an ion-implantation process for the wafers 290 on the table 300 is finished, (a) an unloading step of the ion-implanted wafers 290 from the vacuum tube 301, (b) an adjustment step of the beams 27a and 272, (c) a loading step of new wafers 290 onto the table 300, and (d) a pumping step of the chamber 301 for vacuum are necessarily performed for a next ion-implantation process. As a result, a lot of time needs to be spent between the two, successive ion-implantation processes, which degrades the operating or working efficiency of the conventional ion-implantation system in FIG. 1.

SUMMARY OF THE INVENTION

Accordingly, an object of the present invention is to provide an ion-implantation system capable of successive ion-implantation processes to a same target under different ion-implantation conditions.

Another object of the present invention is to provide an ion-implantation system that raises the operating or working efficiency of an ion-implantation system.

The above objects together with others not specifically mentioned will become clear to those skilled in the art from the following description.

An ion-implantation system according to the present invention is comprised of an ion generator for generating an initial ion beam of charged ions, an ion-beam splitter for splitting the initial ion beam into first to n-th ion beams where n is an integer greater than unity, an acceleration-energy controller for independently controlling the acceleration energies of the first to n-th ion beams, an ion-beam selector for selecting one of the first to n-th ion beams, and a target holder for holding a target thereon.

The selected one of the first to n-th ion beams is irradiated to the target on the target holder, thereby implanting the charged ions contained in the initial ion beam into the target.

With the ion-implantation system according to the present invention, the ion-beam splitter splits the initial ion beam into first to n-th ion beams and the acceleration-energy controller controls the acceleration energies of the first to n-th ion beams. Further, the ion-beam selector makes it possible to select a desired one of the first to n-th ion beams, thereby allowing the selected one of the first to n-th ion beams to be irradiated to the target held on the target holder.

Therefore, for example, after properly changing the acceleration energies of the first to n-th ion beams with the use of the acceleration-energy controller, a desired one of the first to n-th ion beams is selected to be irradiated to the target on the holder by using the ion-beam selector during an ion-implantation process. Following this, another desired one of the first to n-th ion beams is selected to be irradiated to the same target on the holder by using the ion-beam selector during a next ion-implantation process.

As a result, two ion-implantation processes can be successively performed to the same target under different implantation conditions. This means that the above steps (a) to (d) are unnecessary. Consequently, the operating or working efficiency of the ion-implantation system is raised.

In a preferred embodiment of the ion implantation system according to the invention, the ion-beam splitter includes an electrode and a power supply for supplying a splitting voltage to the electrode.

There is an additional advantage that the ion-beam splitter has a simple configuration.

In another preferred embodiment of the ion implantation system according to the invention, the acceleration-energy controller includes an acceleration tube through which one of the first to n-th ion beams travels, an acceleration electrode fixed around the acceleration tube, a power supply for supplying an acceleration voltage to the acceleration electrode, and a switch for switching on and off the supply of the acceleration voltage to the acceleration electrode.

There is an additional advantage that the acceleration-energy controller is realized with a simple configuration.

In still another preferred embodiment of the ion implantation system according to the invention, the acceleration-energy controller includes first to n-th accelerators for accelerating the charged ions in the first to n-th ion beams, respectively. The first to n-th accelerators are designed to independently activate their acceleration operations.

There is an additional advantage that the controllable range of the acceleration-energy controller is enlarged.

In a further preferred embodiment of the ion implantation system according to the invention, the acceleration-energy controller includes first to n-th acceleration tubes through which the first to n-th ion beams travel, first to n-th acceleration electrodes fixed around the first to n-th acceleration tubes, first to n-th power supplies for supplying first to n-th acceleration voltages to the first to n-th acceleration electrodes, and first to n-th switches for switching on and off the supply of the first to n-th acceleration voltages to the first to n-th acceleration electrodes.

In this case, by switching on or off the first to n-th switches and/or making the first to n-th acceleration voltages different, there arises an additional advantage that the acceleration energies of the first to n-th ion beams (i.e., the ion-implantation conditions by the first to n-th ion beams) can be readily changed or adjusted.

In a still further preferred embodiment of the ion implantation system according to the invention, the acceleration-energy controller includes a deceleration electrode fixed around a path of one of the first to n-th ion beams, a power supply for supplying a deceleration voltage to the deceleration electrode, and a switch for switching on and off the supply of the deceleration voltage to the deceleration electrode.

There is an additional advantage that the acceleration-energy controller is realized with a simple configuration.

In a still further preferred embodiment of the ion implantation system according to the invention, the acceleration-energy controller includes first to n-th decelerators for decelerating the charged ions in the first to n-th ion beams, respectively. The first to n-th decelerators are designed to independently activate their deceleration operations.

There is an additional advantage that the controllable range of the acceleration-energy controller is enlarged.

In a still further preferred embodiment of the ion implantation system according to the invention, the acceleration-energy controller includes first to n-th deceleration electrodes fixed around paths of the first to n-th ion beams, first to n-th power supplies for supplying first to n-th deceleration voltage to the first to n-th deceleration electrodes, and first to n-th switches for switching on and off the supply of the first to n-th deceleration voltages to the first to n-th deceleration electrodes.

In this case, by switching on or off the first to n-th switches and/or making the first to n-th deceleration voltages different, there arises an additional advantage that the acceleration energies of the first to n-th ion beams (i.e., the ion-implantation conditions by the first to n-th ion beams) can be readily changed or adjusted.

BRIEF DESCRIPTION OF THE DRAWINGS

In order that the invention may be readily carried into effect, ti will now be described with reference to the accompanying drawings.

DETAILED DESCRIPTION OF THE PREFERRED EMBODIMENTS

Figure 1:
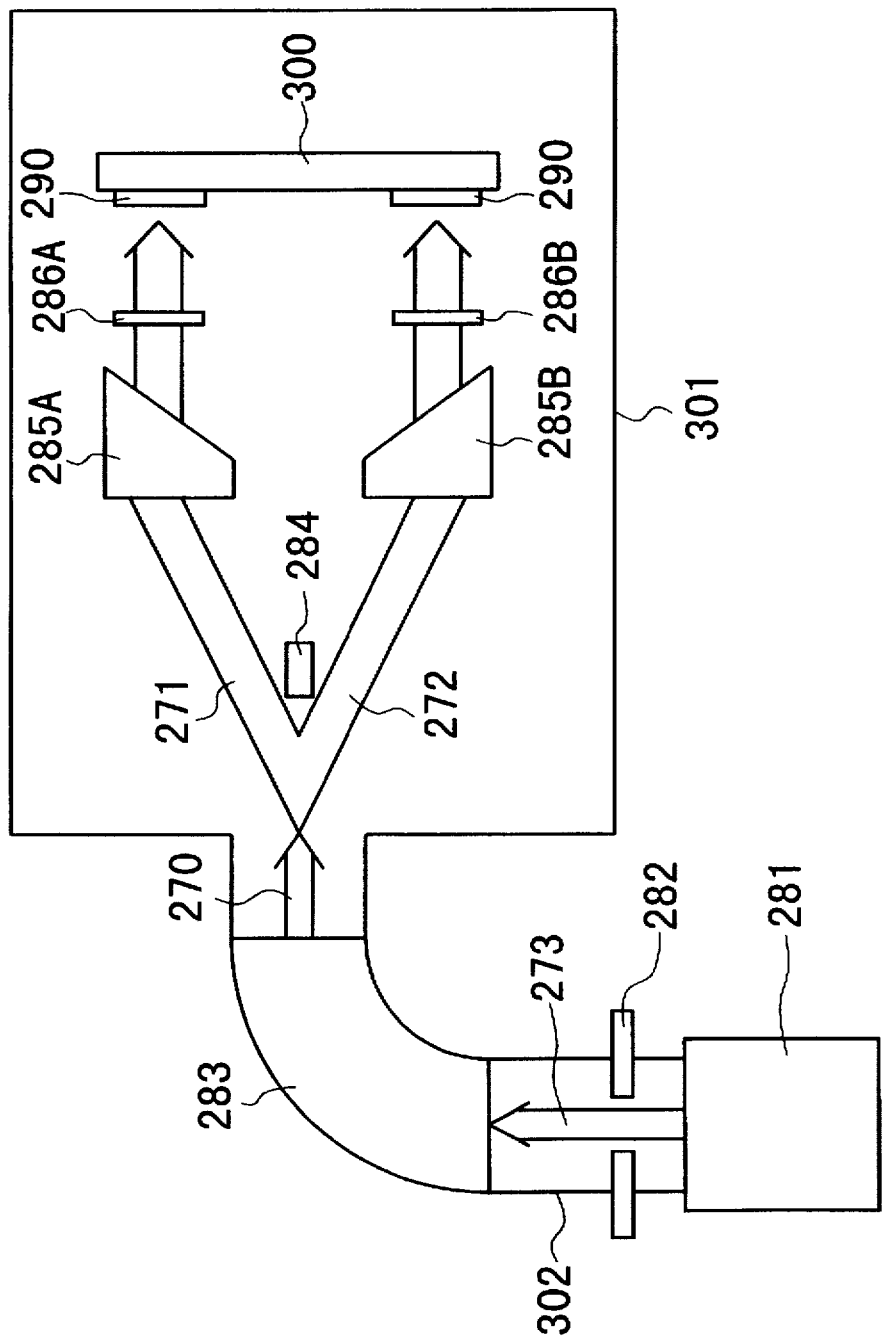
FIG. 1 is a schematic illustration showing the configuration of a conventional ion-implantation system.

Preferred embodiments of the present invention will be described below referring to the drawings attached.

Basic Configuration

Figure 2:
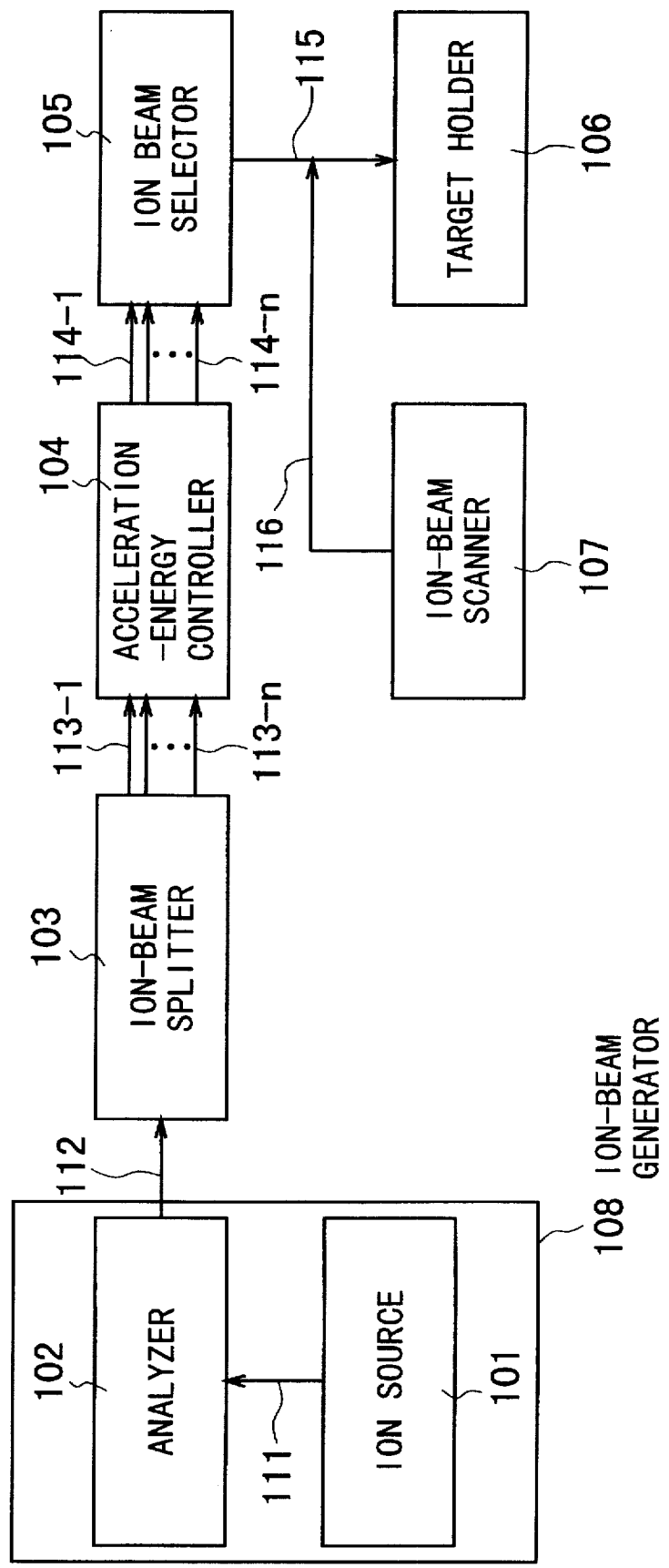
FIG. 2 is a block diagram showing the basic configuration of an ion-implantation system according to the present invention.

An ion-implantation system according to the present invention has a basic configuration as shown in FIG. 2.

In FIG. 2, this ion-implantation system is comprised of an ion source 101, a mass analyzer 102, an ion-beam splitter 103, an acceleration-energy controller 104, an ion-beam selector 105, a target holder 106, and an ion-beam scanner 107. The ion source 101 and the mass analyzer 102 serve as an ion-beam generator 108.

The ion source 101 generates charged dopant ions (i.e., ionized atoms or molecules) and other species, and emits the charged dopant ions as a beam 111 toward the analyzer 102. The beam 111 is extracted and accelerated up to a specific acceleration energy by an extraction magnet(not shown). The configuration of the ion source 101 is the same as that of the conventional one in FIG. 1.

The mass analyzer 102 selects the desired ions with a specific positive charge in the beam 111 using a magnetic field generated by a magnet 1 (see FIG. 3) of the analyzer 102, thereby emitting an initial ion beam 112 of the desired dopant ions toward the ion-beam splitter 103. The configuration of the analyzer 102 is the same as that of the conventional one in FIG. 1.

In other words, the ion-beam generator 107 generates and emits the initial ion beam 112 containing the desired dopant ions and having the specific acceleration energy toward the ion-beam splitter 103.

The ion-beam splitter 103 splits the initial ion beam 112 thus emitted from the analyzer 102 into first to n-th ion beams 113-1 to 113-n, where n is an integer greater than unity (i.e., n>1). Each of the first to n-th ion beams 113-1 to 113-n contains the dopant ions of the same sort and has the same acceleration energy.

The acceleration-energy controller 104 independently controls (i.e., increases and/or decreases) the acceleration energy of the first to n-th ion beams 113-1 to 113-n, emitting first to n-th energy-controlled ion beams 114-1 to 114-n toward the ion-beam selector 105.

The ion-beam selector 105 selects one of the first to n-th energy-controlled ion beams 114-1 to 114-n, irradiating a selected one of the first to n-th ion beams 114-1 to 114-n as a final ion beam 115 to a target held on the target holder 106.

The ion-beam scanner 107 generates magnetic fields 116 for scanning the final ion beam 115 over the whole target on the holder 106.

Typically, the beam 111 travels to the analyzer 102 through a vacuum tube or chamber (not shown). The initial ion beam 112, the first to n-th ion beams 113-1 to 113-n, the energy-controlled ion beams 114-1 to 114-n, and the final ion beam 115 also travel within vacuum tubes or paths. The target holder 106 is located in a vacuum tube termed an "implantation tube or chamber".

First Embodiment

Figure 3:
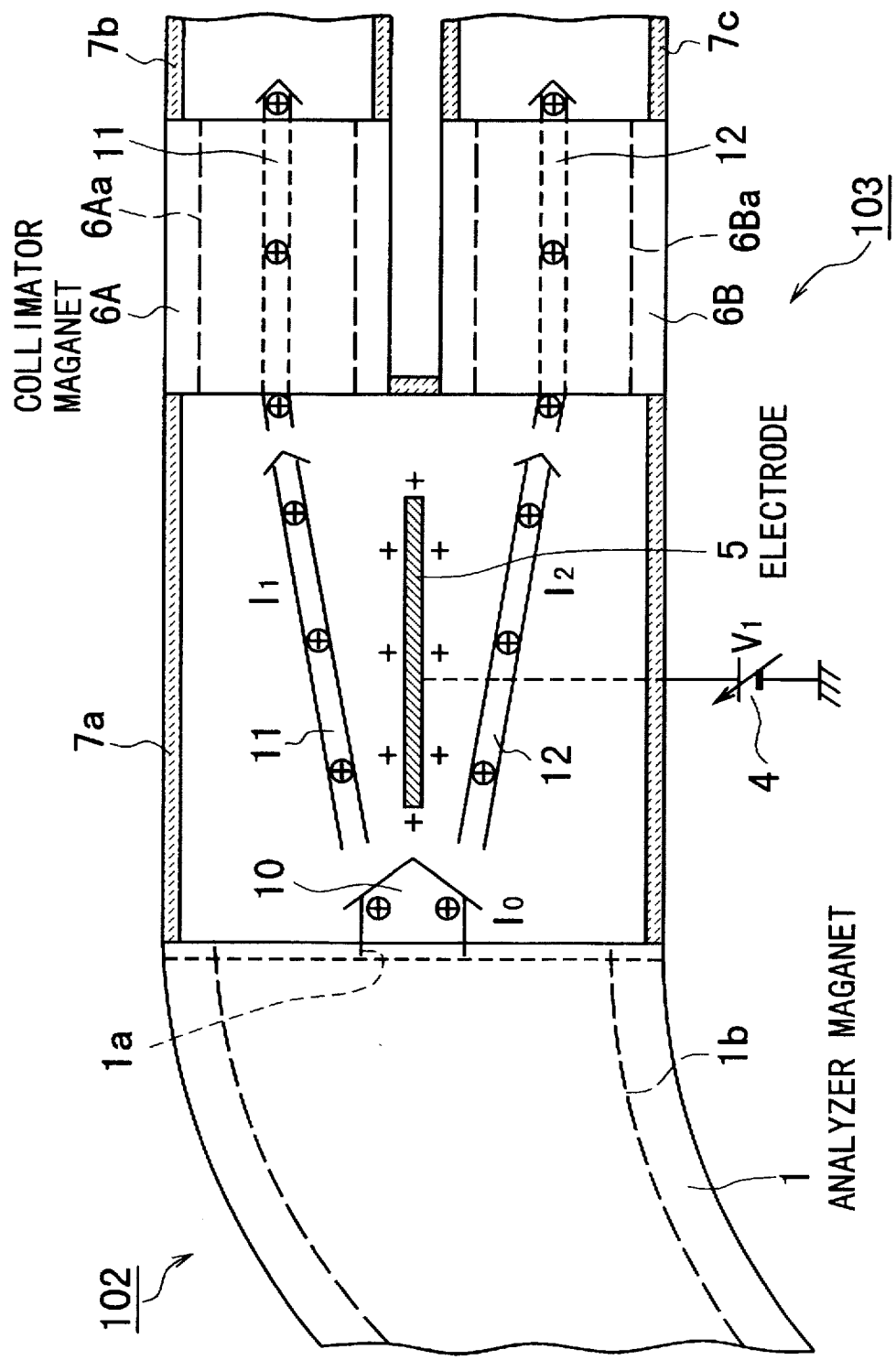
FIG. 3 is a schematic, partial illustration of an ion-beam splitter of an ion-implantation system according to a first embodiment of the present invention and its neighborhood, in which the vacuum tubes are partially cut away.
Figure 4:
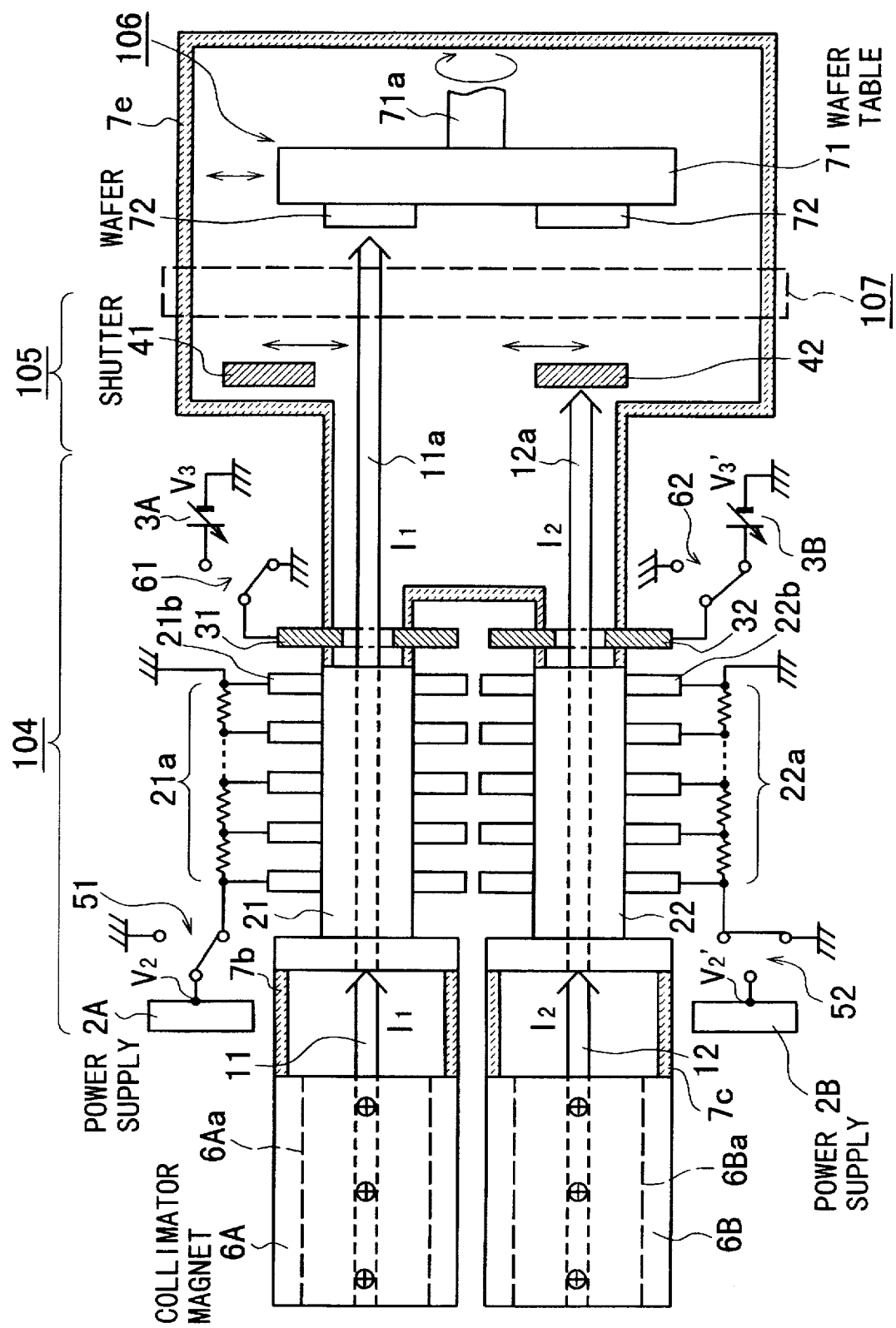
FIG. 4 is a schematic, partial illustration of an acceleration-energy controller, an ion-beam selector, and a target holder of the ion-implantation system according to the first embodiment in FIG. 3, in which the vacuum tubes are partially cut away.

In an ion-implantation system according to a first embodiment of the present invention, the ion-beam splitter 103 has a configuration as shown in FIG. 3 and the acceleration-energy controller 104, the ion-beam selector 105, and the target holder 106 has configurations as shown in FIG. 4, respectively. A semiconductor wafer is used as the target. This system corresponds to a case where the number n is set as 2 (i.e., n=2) in the basic configuration in FIG. 2.

In FIG. 3, an end of a vacuum tube 7a is connected to a drifting tube 1b located in the magnet 1 of the analyzer 102, and another end thereof is connected to drifting tubes 6Aa and 6Ba in first and second collimator magnets 6A and 6B. The drifting tube 1b, which is electrically connected to the ground, penetrates the curved magnet 1 of the analyzer 102. The drifting tubes 6Aa and 6Ba penetrate the linear collimator magnets 6A and 6B, respectively. The tubes 6Aa and 6Ba are electrically connected to the ground. The magnet 1 and the collimator magnets 6A and 6B are formed by electromagnets, respectively.

Ends of the drifting tubes 6Aa and 6Ba in the first and second collimator magnets 6A and 6B are connected to opposing ends of vacuum tubes 7b and 7c, respectively.

An initial ion beam 10, which corresponds to the initial ion beam 112 in FIG. 2, is emitted from an aperture 1a of the drifting tube 1b of the analyzer magnet 1 into the vacuum tube 7a. The initial ion beam 10 contains the desired dopant ions with a specific positive charge and has a specific acceleration energy.

The ion-beam splitter 103 includes a strip-shaped splitting electrode 5 fixed on the traveling path of an initial ion beam 10 within the vacuum tube 7a. The traveling path of the initial ion beam 10 is located on the longitudinal axis of the tube 7a.

The electrode 5 is electrically connected to the positive terminal of a power supply 4 supplying a variable dc voltage $V_1$. The negative terminal of the power supply 4 is electrically connected to the ground. Here, $V_1$ is set as a constant voltage of 20 kV. The power supply 4 is located outside the vacuum tube 7a. The splitting electrode 5 has a positive potential of $V_1$ (=20 kV) with respect to the ground.

The first and second collimator magnets 6A and 6B are fixed between the opposing ends of the vacuum tube 7a and the vacuum tubes 7b and 7c in such a way that the tube 7a communicates with the tubes 7b and 7c through the drifting tubes 6Aa and 6Ba, respectively.

The initial ion beam 10 forms an electric current of $I_0$. Since the electrode 5 is positively charged at $V_1$ due to the power supply 4, the beam 10 is repulsed due to a repulsive force between the beam 10 and the electrode 5 to be split into two. Thus, first and second ion beams 11 and 12 with the same acceleration energy are formed, as shown in FIG. 3. The beams 11 and 12 form electric currents of $I_1$ and $I_2$, respectively, where $I_1+I_2=I_0$.

Since the first and second ion beams 11 and 12 are formed by the repulsive force, they do not travel along the longitudinal axis of the chamber 7a or the traveling path of the initial ion beam 10. Therefore, the beams 11 and 12 are collimated by the first and second collimator magnets 6A and 6B, respectively, thereby causing the beams 11 and 12 to travel along the longitudinal axis of the chamber 7a, as shown in FIG. 3.

The collimated beams 11 and 12 then travel in the vacuum tubes 7b and 7c toward the acceleration-energy controller 104, respectively.

As described above, the drifting tube 1b in the analyzer magnet 1 and the drifting tubes 6Aa and 6Ba in the collimator magnets 6A and 6B are electrically connected to the ground; in other words, they have the same ground potential. Therefore, the initial acceleration energy (for example, +60 keV) of the initial ion beam 10, which has been given in the ion-beam generator 108, is kept unchanged while the first and second ion beams 11 and 12 travel through the vacuum tube 7a, the collimator magnets 6A and 6B, and the vacuum tubes 7b and 7c.

As shown in FIG. 4, the ion-beam controller 104 includes first and second acceleration tubes 21 and 22, a first set of serially-connected resistors 21a for the first acceleration tube 21, a second set of serially-connected resistors 22a for the second acceleration tube 22, a first set of ring-shaped acceleration electrodes 21b for the first acceleration tube 21, and a second set of ring-shaped acceleration electrodes 22b for the second acceleration tube 22a.

An end of the first acceleration tube 21 is connected to the opposing end of the vacuum tube 7b, and another end thereof is connected to an opposing, protruding end of a vacuum tube 7e. The tube 7e serves as an implantation tube or chamber. The first set of acceleration electrodes 21b are fixed onto the outside surface of the acceleration tube 21, and are arranged along the longitudinal axis of the tube 21 at regular intervals. Each of the first set of resistors 21a is electrically connected to adjacent two ones of the electrodes 21a. An end of the serially-connected resistors 21a is electrically connected to a power supply 2A through a switch 51, and another end thereof is electrically connected to the ground. The power supply 2A supplies a variable dc voltage $V_2$ and is located outside the tube 21.

If the switch 51 is turned on so that the positive supply voltage $V_2$ is applied across the both ends of the serially-connected resistors 21a, the electric potentials at the acceleration electrodes 21a with respect to the ground decreases from +$V_2$ to zero stepwise with the increasing distance from the opposing end of the vacuum tube 7b to the acceleration tube 21. Thus, the first ion beam 11 is accelerated by the acceleration operation produced by the first acceleration electrodes 21b while it travels through the tube 21.

If the switch 51 is turned off, both the ends of the serially-connected resistors 21a are electrically connected to the ground. Therefore, no acceleration operation is applied to the first ion beam 11.

Similarly, an end of the second acceleration tube 22 is connected to the opposing end of the vacuum tube 7c, and another end thereof is connected to another opposing, protruding end of the vacuum chamber 7e. The second set of acceleration electrodes 22b are fixed onto the outside surface of the acceleration tube 22, and are arranged along the longitudinal axis of the tube 22 at regular intervals. Each of the second set of resistors 22a is electrically connected to adjacent two ones of the electrodes 22a. An end of the serially-connected resistors 22a is electrically connected to a power supply 2B through a switch 52, and another end thereof is electrically connected to the ground. The power supply 2B supplies a variable dc voltage $V_2'$ and is located outside the tube 22.

If the switch 52 is turned on so that the supply voltage $V_2'$ is applied across the both ends of the serially-connected resistors 22a, the electric potentials at the acceleration electrodes 22a with respect to the ground decreases from $V_2'$ to zero stepwise with the increasing distance from the opposing end of the vacuum tube 7c. Thus, the second ion beam 12 is accelerated by the acceleration operation produced by the second acceleration electrodes 22b while it travels through the tube 22.

If the switch 52 is turned off, both the ends of the serially-connected resistors 22a are electrically connected to the ground. Therefore, no acceleration operation is applied to the second ion beam 12.

The ion-beam controller 104 further includes first and second ring-shaped deceleration electrodes 31 and 32, two switches 61 and 62, and two power supplies 3A and 3B.

The first deceleration electrode 31 is fixed onto the outside surface of a corresponding one of the protruding parts of the vacuum chamber 7e. The electrode 31 is electrically connected to the positive terminal of the power supply 3A through the switch 61. The negative terminal of the power supply 61 is electrically connected to the ground. The power supply 3A supplies a variable dc voltage $V_3$ and is located outside the chamber 7e.

If the switch 61 is turned on so that the positive supply voltage $V_3$ is applied to the first deceleration electrode 31, the electric potential at the electrode 31 with respect to the ground increases from zero to $V_3$. Thus, the first ion beam 11 is decelerated by the deceleration operation produced by the first deceleration electrode 31 while it travels through the protruding portion of the chamber 7e.

If the switch 61 is turned off, the deceleration electrode 31 is electrically connected to the ground. Therefore, no deceleration operation is applied to the first ion beam 11.

Similarly, the second deceleration electrode 32 is fixed onto the outside surface of a corresponding one of the protruding parts of the vacuum chamber 7e. The electrode 32 is electrically connected to the positive terminal of the power supply 3B through the switch 62. The negative terminal of the power supply 62 is electrically connected to the ground. The power supply 3B supplies a variable dc voltage $V_3'$ and is located outside the chamber 7e.

If the switch 62 is turned on so that the positive supply voltage $V_3'$ is applied to the second deceleration electrode 32, the electric potential at the electrode 32 with respect to the ground increases from zero to $V_3'$. Thus, the second ion beam 12 is decelerated by the deceleration operation produced by the second deceleration electrode 32 while it travels through the protruding portion of the chamber 7e.

If the switch 61 is turned off, the deceleration electrode 31 is electrically connected to the ground. Therefore, no deceleration operation is applied to the first ion beam 11.

The ion-beam selector 105 includes first and second shutters 41 and 42 in the implantation chamber 7e. The shutters 41 and 42 are movable along a direction perpendicular to the traveling direction of first and second ion beams 11a and 12a, the acceleration energies of which are controlled by the controller 104. If the first and second shutters 41 and 42 are opened, the ion beams 11a and 12a reach the rotatable wafer table 71 serving as the target holder 106 in FIG. 2. If the shutters 41 and 42 are closed, the ion beams 11a and 12a are blocked so as not to reach the wafer table 71.

On the wafer table 71, semiconductor wafers 72 as the target are placed along the circumference of the circular table 71 at regular intervals. Each of the wafers 72 is positioned at a location to which the ion beam 11a or 12a is irradiated.

The ion-beam scanner 107 is laid out in the space between the first and second shutters 41 and 42 and the wafer table 71, as shown in FIG. 4. The ion-beam scanner 107 has the same configuration as that in the conventional one and therefore, no detailed explanation is disclosed here.

Next, the operation of the ion-implantation system according to the first embodiment is explained below.

Here, it is supposed that each of the wafers 72 is subjected to first and second ion-implantation processes. In the first ion-implantation process, the dopant ion is $^{11}B^+$, the acceleration energy is +150 keV, and the dose is $1.0\times10^{-13}$ atoms/cm$^2$. In the second ion-implantation process, the dopant ion is $^{11}B^+$, the acceleration energy is +30 keV, and the dose is $4.0\times10^{-12}$ atoms/cm$^2$.

The initial ion beam 10, which is emitted from the analyzer magnet 1, contains the boron ions $^{11}B^+$ as the dopant ions and has the acceleration energy of +60 keV.

The initial ion beam 10 is split into the first and second ion beams 11 and 12 due to the repulsion force generated by the splitting voltage $V_1$ of +20 kV at the splitting electrode 5. The ion beams 11 and 12 are then collimated by the collimator magnets 6A and 6B, respectively, thereby causing the beams 11 and 12 to travel along the longitudinal axis of the tubes 7a, 7b, and 7c.

Subsequently, the first and second ion beams 11 and 12 having passed through the collimator magnets 6A and 6B enter the first and second acceleration tubes 21 and 22, respectively.

In the first embodiment, as shown in FIG. 4, the acceleration switch 51 is turned on and therefore, an acceleration energy of +90 keV is added to the first ion beam 11 having the initial acceleration energy of +60 keV. Thus, the first ion beam 11 has the resultant acceleration energy of +150 keV at the outlet of the first acceleration tube 21.

On the other hand, the acceleration switch 52 is turned off to be kept at the ground potential. Therefore, no acceleration energy is added to the second ion beam 12 having the initial acceleration energy of +60 keV. Thus, the second ion beam 12 has the same acceleration energy of +60 keV at the outlet of the second acceleration tube 22.

Further, the first and second ion beams 11 and 12 having passed through the corresponding acceleration tubes 21 and 22 enter the first and second deceleration electrodes 31 and 32, respectively.

In the first embodiment, as shown in FIG. 4, the deceleration switch 61 is turned off to be kept at the ground potential. Therefore, no deceleration energy is added to the first ion beam 11 having the acceleration energy of +150 keV. Thus, the first ion beam 11 has the same acceleration energy of +150 keV even after passing through the first deceleration electrode 31.

On the other hand, the deceleration switch 62 is turned on and therefore, a deceleration energy of −30 keV is added to the second ion beam 12 having the acceleration energy of +60 keV. Thus, the second ion beam 12 has the resultant acceleration energy of +30 keV after passing through the second deceleration electrode 32.

When the first ion-implantation process is performed, the shutter 41 is opened and the shutter 42 is closed, as shown in FIG. 4. Therefore, the first ion beam 11a serving as the final ion beam 115 in FIG. 2 may reach a corresponding one of the wafers 72 on the wafer table 71, and the second ion beam 11b is blocked not to reach a corresponding one of the wafers 72 on the table 71. Thus, the boron ions $^{11}B^+$ are implanted into the wafer 72 in question with the acceleration energy of +150 keV at a dose of $1.0 \times 10^{13}$ atoms/cm$^2$.

After the first ion-implantation process is finished, the wafer table 71 is turned around its horizontal axis 71a by a specific angle until the ion-implanted wafer 72 is positioned at a location corresponding to the second ion beam 12a. At the same time, the first shutter 41 is closed and the second shutter 42 is opened.

Then, in the same way as that of the first ion-implantation process, the ion-implanted wafer 72 is further irradiated by the second ion beam 12a serving as the final ion beam 115 in FIG. 2 during the second ion-implantation process. Thus, the boron ions $^{11}B^+$ are implanted into the same wafer 72 in question again with the acceleration energy of +30 keV at a dose of $4.0 \times 10^{12}$ atoms/cm$^2$.

As described above, with the ion-implantation system according to the first embodiment, the ion-beam splitter 103 splits the initial ion beam 10 into the first and second ion beams 11 and 12, and the acceleration-energy controller 104 controls the acceleration energies of the first and second ion beams 11 and 12. Further, the first and second shutters 41 and 42 serving as the ion-beam selector 105 select one of the first and second energy-controlled ion beams 11a and 12a to thereby irradiate the selected one of the beams 11a and 12a toward the wafer 72 as the final ion beam 115.

Therefore, the two ion-implantation processes may be successively performed to the same wafer 72 under different implantation conditions. During these two implantation processes, no replacement of the wafers 72 on the wafer table 71 nor adjustment of the acceleration and deceleration voltages or energies are necessary. This raises the operating or working efficiency of the ion-implantation system.

SECOND EMBODIMENT

Figure 5:
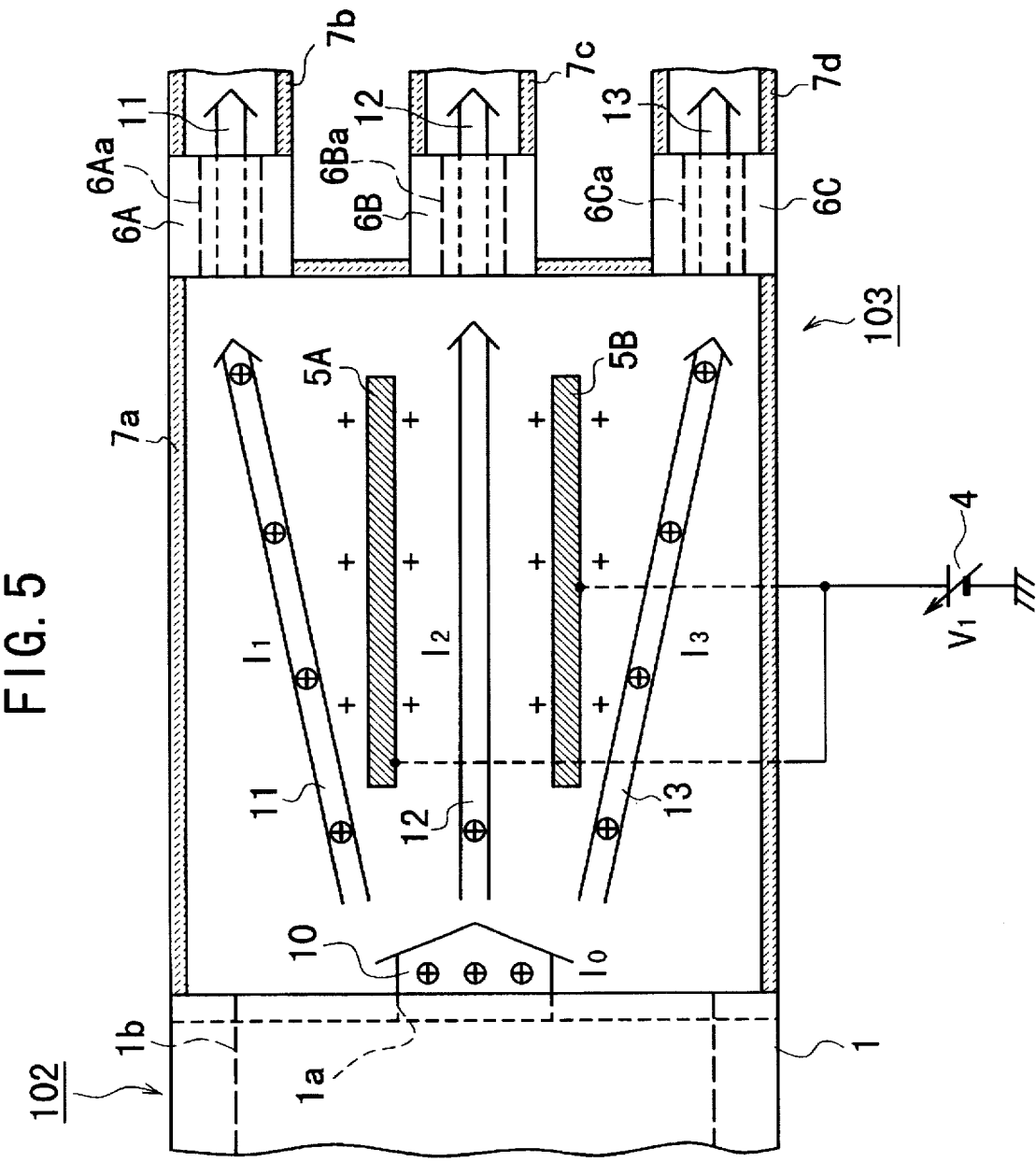
FIG. 5 is a schematic, partial illustration of an ion-beam splitter of an ion-implantation system according to a second embodiment, in which a vacuum chamber is partially cut away.
Figure 6:
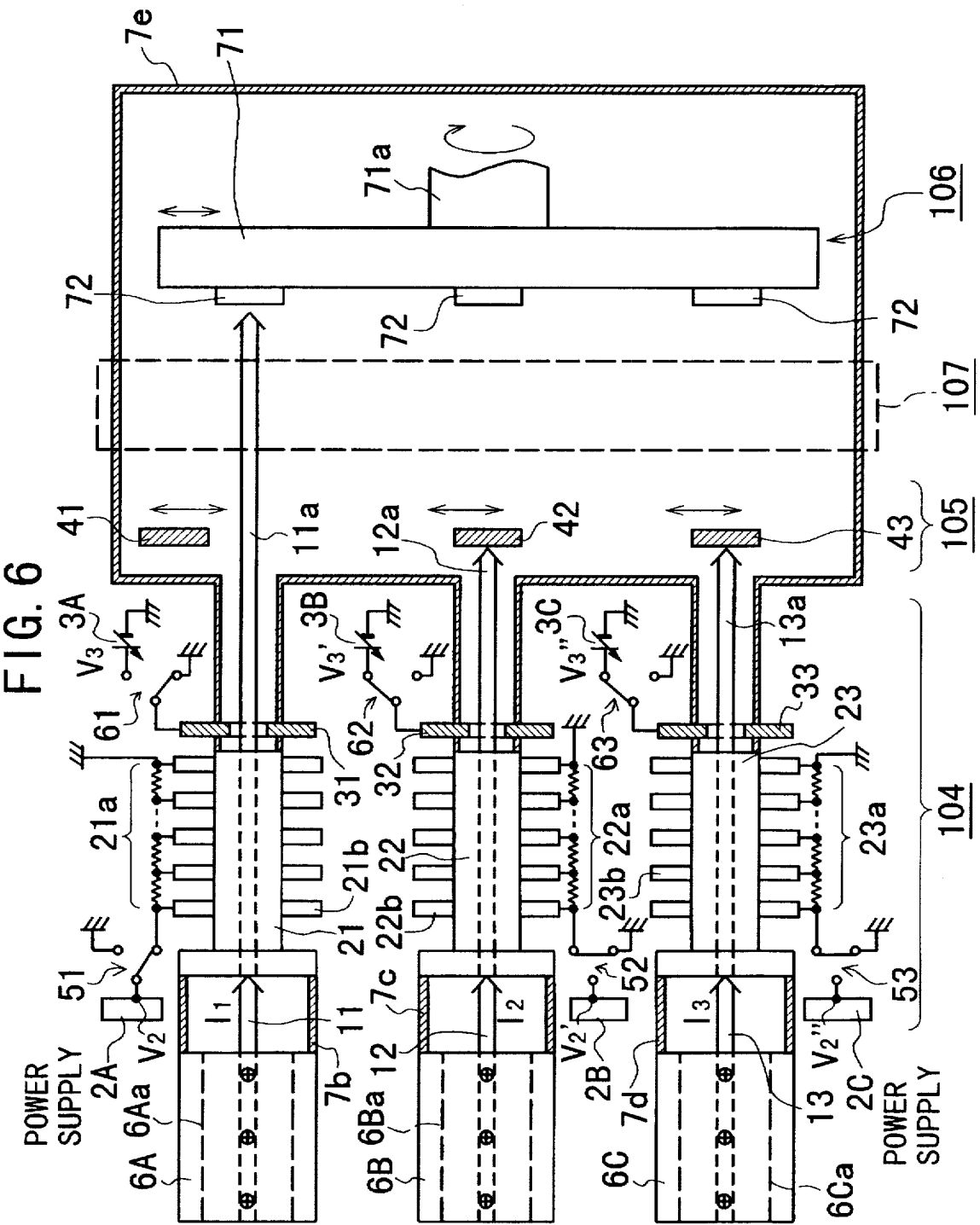
FIG. 6 is a schematic, partial illustration of the acceleration-energy controller, an ion-beam selector, and a target holder of the ion-implantation system according to the second embodiment in FIG. 5, in which the vacuum tubes are partially cut away.

An ion-implantation system according to a second embodiment is shown in FIGS. 5 and 6, which has the same configuration as that of the system according to the first embodiment, except that the initial ion beam 10 is split into first, second, and third ion beams 11, 12, and 13. Therefore, the description relating to the same configuration is omitted here by adding the same reference numerals to the corresponding elements in FIGS. 5 and 6 for the sake of simplification of description.

In the system according to the second embodiment, the ion-beam splitter 103 has a configuration as shown in FIG. 5 and the acceleration-energy controller 104, the ion-beam selector 105, and the target holder 106 has configurations as shown in FIG. 6. This system corresponds to a case where the number n is set as 3 (i.e., n=3) in the basic configuration in FIG. 2.

In FIG. 5, the end of the vacuum tube 7a is connected to the drifting tube 1b in the analyzer magnet 1, and the other end thereof is connected to drifting tubes 6Aa, 6Ba, and 6Ca in first, second, and third collimator magnets 6A, 6B, and 6C. The drifting tubes 6Aa, 6Ba, and 6Ca penetrate the collimator magnets 6A, 6B, and 6C, respectively. The tubes 6Aa, 6Ba, and 6Bc are electrically connected to the ground. The collimator magnets 6A, 6B, and 6C are formed by electromagnets, respectively.

The ion-beam splitter 103 includes first and second strip-shaped splitting electrodes 5A and 5B fixed at the locations symmetric with the traveling path of the initial ion beam 10 within the vacuum tube 7a. The two electrodes 5A and 5B are electrically connected in common to the positive terminal of the power supply 4 supplying the variable dc voltage $V_1$, where $V_1$=20 kV here. The negative terminal of the power supply 4 is electrically connected to the ground. Therefore, the splitting electrodes 5A and 5B have the same positive potential of $V_1$ with respect to the ground.

The three collimator magnets 6A, 6B, and 6C, each of which is formed by an electromagnet, are fixed at the connecting end of the tube 7a to vacuum tubes 7b, 7c, and 7d, respectively.

Since the first and second electrodes 5A and 5B are positively charged at $V_1$ due to the power supply 4, the beam 10 is repulsed due to the repulsive forces between the beam 10 and the respective electrodes 5A and 5B to be split into three. Thus, first, second, and third ion beams 11, 12, and 13 with the same acceleration energy are formed, as shown in FIG. 5. The beams 11, 12, and 13 form electric currents of $I_1$, $I_2$, and $I_3$, respectively, where $I_1+I_2+I_3=I_0$.

Since the three ion beams 11, 12, and 13 are formed by the corresponding repulsive forces, they do not travel along the longitudinal axis of the chamber 7a or the traveling direction of the ion beam 10. Therefore, the beams 11, 12, and 13 are collimated by the first, second, and third collimator magnets 6A, 6B, and 6C, respectively, thereby causing the bemas 11, 12, and 13 to travel along the longitudinal axis of the chamber 7a, as shown in FIG. 5.

As described above, the drifting tube 1b in the analyzer magnet 1 and the drifting tubes 6Aa, 6Ba, and 6Ca in the collimator magnets 6A, 6B, and 6C are electrically connected to the ground, in other words, they have the same ground potential. Therefore, the initial acceleration energy (for example, +60 keV) of the initial ion beam 10, which has been given in the ion-beam generator 107, is kept unchanged while the first, second, and third ion beams 11, 12, and 13 travel through the vacuum tube 7a and the collimator magnets 6A, 6B, and 6C.

As shown in FIG. 6, the ion-beam controller 104 includes first, second, and third acceleration tubes 21, 22, and 23, a first set of serially-connected resistors 21a for the first acceleration tube 21, a second set of serially-connected resistors 22a for the second acceleration tube 22a, a third set of serially-connected resistors 23a for the third acceleration tube 23a, a first set of ring-shaped acceleration electrodes 21b for the first acceleration tube 21, a second set of ring-shaped acceleration electrodes 22b for the second acceleration tube 22a, and a third set of ring-shaped acceleration electrodes 23b for the third acceleration tube 23a.

Similar to the acceleration tubes 21 and 22, an end of the acceleration tube 23 is connected to the opposing end of the vacuum tube 7d, and another end thereof is connected to the opposing, protruding end of the vacuum chamber 7e. The third set of acceleration electrodes 23b are fixed onto the outside surface of the third acceleration tube 23 and are arranged along the longitudinal axis of the tube 23 at regular intervals. Each of the third set of resistors 23a is electrically connected to adjacent two ones of the electrodes 23a. An end of the third set of serially-connected resistors 23a is electrically connected to a power supply 2C through a switch 53, and another end thereof is electrically connected to the ground. The power supply 2C supplies a variable dc voltage $V_2''$ and is located outside the tube 23.

If the switch 53 is turned on so that the positive supply voltage $V_2''$ is applied across the both ends of the third set of resistors 23a, the electric potentials at the third set of acceleration electrodes 23a with respect to the ground decreases from $+V_2$ to zero stepwise with the increasing distance from the opposing end of the vacuum tube 7d. Thus, the third ion beam 13 is accelerated by the acceleration operation produced by the third set of acceleration electrodes 23b while it travels through the tube 23.

If the switch 53 is turned off, both the ends of the serially-connected resistors 23a are electrically connected to the ground. Therefore, no acceleration operation is applied to the third ion beam 13.

The ion-beam controller 104 further includes a third ring-shaped deceleration electrode 33, a switch 63, and a power supply 3C.

The deceleration electrode 33 is fixed onto the outside surface of a corresponding one of the protruding parts of the vacuum chamber 7e. The electrode 33 is electrically connected to the power supply 3C through the switch 63. The power supply 3C supplies a variable dc voltage of $+V_3''$ and is located outside the chamber 7e. Here, $V_3''=50$ kV.

If the switch 63 is turned on so that the supply voltage $+V_3''$ is applied to the deceleration electrode 33, the electric potential at the deceleration electrode 33 with respect to the ground increases from zero to $+V_3''$. Thus, the third ion beam 13 is decelerated by the deceleration operation produced by the third deceleration electrode 33 while it travels through the protruding portion of the chamber 7e.

If the switch 63 is turned off, the deceleration electrode 33 is electrically connected to the ground. Therefore, no deceleration operation is applied to the third ion beam 13.

The ion-beam selector 105 further includes a third shutter 43 in the implantation chamber 7e. The shutter 43 is movable along the direction perpendicular to the traveling direction of the ion beam 13a, the acceleration energy of which is controlled by the controller 104. If the shutter 43 is opened, the third ion beam 13a reaches the rotatable wafer table 71 as the target holder 106. If the shutter 43 is closed, the ion beam 13a is blocked so as not to reach the wafer table 71.

Next, the operation of the ion-implantation system according to the first embodiment is explained below.

Here, it is supposed that each of the wafers 72 is subjected to first, second, and third ion-implantation processes. In the first ion-implantation process, the dopant ion is $^{11}B^+$, the acceleration energy is +150 keV, and the dose is $1.0\times10^{-13}$ atoms/cm$^2$. In the second ion-implantation process, the dopant ion is $^{11}B^+$, the acceleration energy is +30 keV, and the dose is $4.0\times10^{-12}$ atoms/cm$^2$. In the third ion-implantation process, the dopant ion is $^{11}B^+$, the acceleration energy is +10 keV, and the dose is $1.0\times10^{-12}$ atoms/cm$^2$.

The initial ion beam 10 contains the boron ions $^{11}B^+$ as the dopant ions and has the acceleration energy of +60 keV, which are the same as those in the first embodiment.

The initial ion beam 10 is split into the first, second, and third ion beams 11, 12, and 13 due to the repulsion forces generated by the splitting voltage $V_1$ of +20 kV at the splitting electrodes 5A and 5B. The three ion beams 11, 12, and 13 are collimated by the corresponding collimator magnets 6A, 6B, and 6C, thereby causing the beams 11, 12, and 13 to travel along the longitudinal axis of the tube 7a.

Subsequently, the ion beams 11, 12, and 13 having passed through the collimator magnets 6A, 6B, and 6C then enter the first, second, and third acceleration tubes 21, 22, and 23, respectively.

In this case, as shown in FIG. 6, the acceleration switch 51 is turned on and therefore, an acceleration energy of +90 keV is added to the first ion beam 11 having the initial acceleration energy of +60 keV. Thus, the first ion beam 11 has the resultant acceleration energy of +150 keV.

On the other hand, the acceleration switch 52 is turned off to be kept at the ground potential. Therefore, no acceleration energy is added to the second ion beam 12 having the initial acceleration energy of +60 keV. Thus, the second ion beam 12 has the resultant acceleration energy of +60 keV. The acceleration switch 53 also is turned off to be kept at the ground potential. Therefor, no acceleration energy is added to the third ion beam 13 having the initial acceleration energy of +60 keV. Thus, the third ion beam 13 also has the resultant acceleration energy of +60 keV.

Further, the three ion beams 11, 12, and 13 having passed through the acceleration tubes 21, 22, and 23 enter the first, second, and third deceleration electrodes 31, 32, and 33, respectively.

In the second embodiment, as shown in FIG. 6, the deceleration switch 61 is turned off to be kept at the ground potential. Therefore, no deceleration energy is added to the first ion beam 11 having the initial acceleration energy of +150 keV. Thus, the first ion beam 11 keeps the resultant acceleration energy of +150 keV.

On the other hand, the deceleration switch 62 is turned on and therefore, a deceleration energy of +30 keV is added to the second ion beam 12 having the acceleration energy of +60 keV. Thus, the second ion beam 12 has the resultant acceleration energy of +30 keV. The deceleration switch 63 is turned on and therefore, a deceleration energy of −50 keV is added to the third ion beam 13 having the acceleration energy of +60 keV. Thus, the third ion beam 13 has the resultant acceleration energy of +10 keV.

When the first ion-implantation process is performed, the first shutter 41 is opened and the second and third shutters 42 and 43 are closed. Therefore, the first ion beam 11a may reach a corresponding one of the wafers 72 on the wafer table 71, and the second and third ion beams 12a and 13a are blocked not to reach corresponding ones of the wafers 72 on the wafer table 71, respectively. Thus, the boron ions $^{11}B^+$ are implanted into the wafer 72 in question with the acceleration energy of +150 keV at a dose of $1.0\times10^{-}$ atoms/cm$^2$.

After the first ion-implantation process is finished, the wafer table 71 is turned around its horizontal axis 71a by a specific angle until the ion-implanted wafer 72 is positioned at a location corresponding to the second ion beam 12a. At the same time, the first and third shutters 41 and 43 are closed and the second shutter 42 alone is opened.

Then, in the same way as that of the first ion-implantation process, the ion-implanted wafer 72 is irradiated by the second ion beam 12a during the second ion-implantation process. Thus, the boron ions $^{11}B^+$ are implanted into the same wafer 72 in question again with the acceleration energy of +30 keV at a dose of $4.0 \times 10^{12}$ atoms/cm$^2$.

After the second ion-implantation process is finished, the wafer table 71 is turned again around its horizontal axis 71a by a specific angle until the ion-implanted wafer 72 is positioned at a location corresponding to the third ion beam 13a. At the same time, the first and second shutters 41 and 42 are closed and the third shutter 43 alone is opened.

Then, in the same way as that of the first ion-implantation process, the ion-implanted wafer 72 twice is irradiated by the third ion beam 13a during the third ion-implantation process. Thus, the boron ions $^{11}B^+$ are implanted into the same wafer 72 in question three times with the acceleration energy of +10 keV at a dose of $1.0 \times 10^{12}$ atoms/cm$^2$.

As described above, with the ion-implantation system according to the second embodiment, the ion-beam splitter 103 splits the initial ion beam 10 into the first, second, and third ion beams 11, 12, and 13, and the acceleration energy controller 104 controls the acceleration energies of these three ion beams 11, 12, and 13. Further, the first, second, and third shutters 41, 42, and 43 serving as the ion-beam selector 105 select one of the first, second, and third ion beams 11a, 12a, and 13a to thereby irradiate the selected one of the beams 11a, 12a, and 13a toward the wafer 72.

Therefore, three ion-implantation processes may be successively performed for the same wafer 72 under different implantation conditions. During the three processes, no replacement of the wafers 72 on the wafer table 71 nor adjustment of the acceleration and deceleration voltages or energies are necessary. This raises the operating or working efficiency of the ion-implantation system.

TESTS

The inventor performed some tests to confirm the advantages of the ion-implantation system according to the present invention under the following conditions.

As the wafer table 71, a circular wafer disk on which 50 wafers can be placed at a time was used. Through this test, 500 wafers were ion-implanted under the same ion-implantation conditions as those of the first and second ion-implantation processes in the first embodiment. In this case, the loading and unloading steps of the wafers were necessarily performed ten times. No adjustment relating to the ion beams was needed after the first and second ion beams were initially adjusted. The necessary operation during the first and second ion-implantation processes is to move the first and second shutters for the 50 wafers on the table alone.

It was known that the total necessary time for the 500 wafers was approximately 70 minutes including the times for the loading/unloading steps of the wafers and the initial adjustment/setting of the first and second ion beams. Additionally, there was an advantage that no fluctuation or variation occurs in the ion-implanted wafers for each lot of the 50 wafers.

For comparison, using the conventional ion-implantation system, 500 wafers were subjected to a first ion-implantation process under the same first ion-implantation condition as that in the first embodiment and then, the same 500 wafers were subjected to a second ion-implantation process under the same second ion-implantation conditions as that in the first embodiment.

In this case, the loading/unloading steps of the wafers and the pumping step of the vacuum tubes need 20 times in total, respectively. Therefore, the loading/unloading and pumping steps took a total time of approximately 100 minutes. The time for the first and second ion-implantation processes were additionally needed. As a result, the total necessary time would be much longer than the total necessary time of approximately 70 minutes in the present invention.

Further, using the conventional ion-implantation system, 50 wafers were subjected to a first ion-implantation process under the same first ion-implantation condition as that in the first embodiment and then, the ion beams are adjusted. Subsequently, next 50 wafers were subjected to a second ion-implantation process under the same second ion-implantation condition as that in the first embodiment. The same processes were repeated ten times. Thus, 500 wafers were ion-implanted in total.

In this case, the adjustment step of the ion beams needed to be repeated 20 times, and it took approximately 40 minutes in total. The time required for the first and second ion-implantation processes were additionally needed. As a result, the total necessary time would be much longer than the total necessary time of approximately 70 minutes in the present invention.

Additionally, there was a disadvantage that comparative large fluctuation or variation occurs in the ion-implanted wafers for each lot of the 50 wafers. This leads to a problem about quality control.

As a result, it was confirmed that the ion-implantation system according to the present invention was able to provide the above-identified advantages compared with the above two conventional methods using the conventional system.

In the above first and second embodiments, although semiconductor wafers are used as the target, any other object may be used as the target. It is needless to say that any dopant ion other than boron ion ($^{11}B^+$) may be used in the present invention, and that the number of the split ion beams may be any number greater than three.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. An ion-implantation system comprising:

an ion generator for generating an initial ion beam of charged ions;

an ion-beam splitter for splitting said initial ion beam into first to n-th ion beams where n is an integer greater than unity;

an acceleration-energy controller for independently controlling the acceleration energies of said first to n-th ion beams;

an ion-beam selector for selecting one of said first to n-th ion beams; and a target holder for holding a target thereon;

wherein the selected one of said first to n-th ion beams is irradiated to said target on said target holder, thereby implanting said charged ions contained in said initial ion beam into said target.

2. An ion-implantation system as claimed in claim 1, wherein said ion-beam splitter includes an electrode and a power supply for supplying a splitting voltage to said electrode.

3. An ion-implantation system as claimed in claim 1, wherein said acceleration-energy controller includes an acceleration tube through which one of said first to n-th ion beams travels, an acceleration electrode fixed around said acceleration tube, a power supply for supplying an acceleration voltage to said acceleration electrode, and a switch for switching on and off the supply of said acceleration voltage to said acceleration electrode.

4. An ion-implantation system as claimed in claim 1, wherein said acceleration-energy controller includes first to n-th accelerators for accelerating said charged ions in said first to n-th ion beams, respectively;

and wherein said first to n-th accelerators are designed to independently activate their acceleration operations.

5. An ion-implantation system as claimed in claim 1, wherein said acceleration-energy controller includes first to n-th acceleration tubes through which said first to n-th ion beams travel, first to n-th acceleration electrodes fixed around said first to n-th acceleration tubes, first to n-th power supplies for supplying first to n-th acceleration voltages to said first to n-th acceleration electrodes, and first to n-th switches for switching on and off the supply of said first to n-th acceleration voltages to said first to n-th acceleration electrodes.

6. An ion-implantation system as claimed in claim 1, wherein said acceleration-energy controller includes a deceleration electrode fixed around a path of one of said first to n-th ion beams, a power supply for supplying a deceleration voltage to said deceleration electrode, and a switch for switching on and off the supply of said deceleration voltage to said deceleration electrode.

7. An ion-implantation system as claimed in claim 1, wherein said acceleration-energy controller includes first to n-th decelerators for decelerating said charged ions in said first to n-th ion beams, respectively;

and wherein said first to n-th decelerators are designed to independently activate their deceleration operations.

8. An ion-implantation system as claimed in claim 1, wherein said acceleration-energy controller includes first to n-th deceleration electrodes fixed around paths of said first to n-th ion beams, first to n-th power supplies for supplying first to n-th deceleration voltages to said first to n-th deceleration electrodes, and first to n-th switches for switching on and off the supply of said first to n-th deceleration voltages to said first to n-th deceleration electrodes.

* * * * *